United States Patent [19]

Grebe et al.

[11] Patent Number: 4,872,844

[45] Date of Patent: Oct. 10, 1989

[54] COMPONENT-CARRYING ADAPTER FOR CHIP CARRIER SOCKET

[75] Inventors: Robert K. Grebe, Scottsdale; John E. Lucius, Glendale; David S. Szczesny, Glendale, all of Ariz.

[73] Assignee: AMP Incorporated, Harrisburg, Pa.

[21] Appl. No.: 216,927

[22] Filed: Jul. 8, 1988

[51] Int. Cl.$^4$ ............................................. H01R 23/72
[52] U.S. Cl. .................................... 439/69; 174/52.4; 361/395
[58] Field of Search ................................... 439/68–73; 361/392, 395, 401–405; 174/52.4

[56] References Cited

U.S. PATENT DOCUMENTS

| | | |
|---|---|---|
| 3,042,591 | 7/1962 | Cado . |
| 3,629,185 | 12/1971 | Schneble, Jr. et al. . |
| 3,907,621 | 9/1975 | Polichette et al. . |
| 3,930,963 | 1/1976 | Polichette et al. . |
| 3,993,802 | 11/1976 | Polichette et al. . |
| 3,994,727 | 11/1976 | Polichette et al. . |
| 4,287,253 | 9/1981 | Leech . |
| 4,342,069 | 7/1982 | Link . |
| 4,423,468 | 12/1983 | Gatto et al. . |
| 4,511,597 | 4/1985 | Teng et al. . |
| 4,516,816 | 5/1985 | Winthrop . |
| 4,519,658 | 5/1985 | Biswas . |
| 4,532,152 | 7/1985 | Elarde . |
| 4,540,226 | 9/1985 | Thompson et al. . |
| 4,588,239 | 5/1986 | Venaleck . |
| 4,594,311 | 6/1986 | Frisch et al. . |
| 4,604,799 | 8/1986 | Gurol . |
| 4,618,739 | 10/1986 | Theobald ............................ 174/52.4 |
| 4,627,678 | 12/1986 | Biswas . |
| 4,645,943 | 2/1987 | Smith, Jr. et al. .................. 307/150 |
| 4,675,538 | 6/1987 | Epstein . |
| 4,750,092 | 6/1988 | Werther . |
| 4,793,058 | 12/1988 | Venaleck . |

FOREIGN PATENT DOCUMENTS 0192233 8/1986 European Pat. Off. .

OTHER PUBLICATIONS

1988, Data Book, Dallas Semiconductor Corp., pp. 20–23, 227–237, and 609–612; Dallas Semiconductor Corp., Dallas, Tex.
AMP Catalog 87-798, Issued 5-87, "IC Sockets", p. 35; AMP Incorporated, Harrisburg, Pa.

Primary Examiner—Neil Abrams
Attorney, Agent, or Firm—Anton P. Ness

[57] ABSTRACT

An adapter substrate (40) for carrying one or more electrical components (80,90), includes plated circuitry to which the components are connectable, to comprise a member securable between a chip carrier socket (20) and a printed circuit panel (14) and provide electrical interconnection therebetween. The electrical components are connected to selected ones of the interconnections between the socket and the panel in order to modify, effect or sense the selected interconnections. While the other interconnections are passed through the substrate such as by plated through-holes (44), the selected interconnections are interrupted by the dielectric material of the substrate (40) and are plated blind holes (46) connected by path segments (120) to be electrically connected to the one or more electrical components; completing the connection to the socket's contacts are plated through-holes (116) and path segments (128) to contact pads (52). Into the plated through-holes and plated blind holes alike can be inserted post members (42) matable with plated through-holes (16) of the panel; contact sections connectable with the socket's contacts (28) can be pads (52) for surface mounting. One such adapter can be used to fabricate an assured backup power supply (10) for an IC chip carried in the socket (20), when a battery (80) and a logic chip control circuit (90) therefor are the electrical components.

20 Claims, 7 Drawing Sheets

COMPONENT-CARRYING ADAPTER FOR CHIP CARRIER SOCKET

FIELD OF THE INVENTION

The present invention relates to the field of electrical connectors and more particularly to sockets for carriers of integrated circuit chips.

BACKGROUND OF THE INVENTION

Sockets are known for containing carriers of integrated circuit (IC) chips having for example 68 contact locations and electrically connecting the conductors of the carriers to circuit panels to which the sockets are mounted, thus electrically interconnecting the 68 contacts of the IC to the circuit panel. Power current for the IC conventionally is transmitted from a remote power source by way of selected conductors of the circuit panel through usually a plurality of terminals of the socket and carrier to circuit paths of the chip. In many applications it is critical to the proper functioning of the electronic apparatus within which the circuit chip is mounted, that the chip maintain memory of the information stored therein. It is desired that there be an absolute continuity of sufficient electrical power supplied to the IC chip at all times, to maintain memory. A random access memory (RAM) is characterized as being volatile when it has no internal memory protection against power failure, with continuous power necessary to maintain the integrity of the data stored therein.

Products are known recently in which a volatile RAM is contained in a dual-in-line package (DIP) which also integrally contains a lithium energy source, or battery, to assure a continuous power source and provide a nonvolatile RAM module package. The module package also includes a control circuit for the battery which constantly monitors primary power input (such as plus five volts) for an out of tolerance condition, such as Part No. DS1220 sold by Dallas Semiconductor Corporation of Dallas, Texas. In such a condition the control circuit switches on the lithium energy source to continue a necessary threshold of power, protects against garbled data, and also maintains the data in the absence of primary power for up to ten years, all without additional support circuitry. Upon resumption of at least threshold primary power, the lithium energy source is disconnected and the RAM module operates at low power until full primary power is restored.

Products are also known which are DIP-style sockets matable with a volatile RAM and which contain an embedded lithium energy source and a built-in CMOS (complementary metal oxide semiconductor) controller circuit. Such a socket monitors the voltage of the incoming primary power, detects an out-of-tolerance condition, and switches on the internal lithium energy source to provide write protection and prevent garbled data. Two similar such products are "SmartSockets" sold by Dallas Semiconductor Corporation, Dallas, Texas under Part No. DS1213 and Part No. DS1213C. Each of these two products includes two lithium energy sources each of, for example, 35 mA-hrs (millampere-hours) and a control circuit which performs five circuit functions required in order to provide battery back-up capability to a CMOS memory: a switch to direct power either from the primary power supplied via the printed circuit panel or the back-up battery; power fail detection using a precision comparator; checking battery status; battery redundancy with an internal isolation switch using two batteries to insure reliability and using the battery with higher voltage; and, providing "write protection" by holding the "chip enable" signal to the memory module to within a fixed voltage deviation from nominal for power, or if the "chip enable" signal is active at point of failure meaning that a byte of data is in the process of being entered into the memory at the moment of power failure, delaying passing through the "write protection" signal to the memory module until the memory cycle is complete to avoid corrupting the data meaning that the subject byte of data has been entered with integrity. The products include adapter boards comprising conventionally fabricated printed circuit board elements containing etched circuitry and conventional plated through-holes to which are mounted and electrically connected the energy sources and logic means, all of which is then conventionally potted or overmolded.

Other similar products also sold by Dallas Semiconductor include a battery manager, having Part No. DS1259 to which a battery can be connected to supply power to CMOS electronic circuits when primary power is lost, especially for use in portable and nonvolatile electronic equipment. Additionally Part No. DS1260 is a lithium energy source of for example 1000 mA-hrs for a system of memory modules, sold under the designation "SmartBattery," which includes an integral control circuit monitoring the primary power to detect out-of-tolerance conditions, switching on the battery to supplant the primary power when necessary, and checking the level of reserve power in the battery and signaling upon detecting significant decline.

It is desired to provide an adapter for an IC chip carrier socket which upon mounting between the printed circuit panel and the socket, interrupts selected circuit paths between the socket and the printed circuit panel to which it is electrically connected, to interpose electrical components between the IC chip mounted into the socket and the panel to modify or affect or respond to selected transmissions along the selected circuit paths without affecting transmissions along the nonselected circuit paths which are passed through the adapter without being affected.

It is desired to provide such an adapter which easily carries the respective electrical component or components with minimum bulk or occupation of panel real estate.

It is desired to provide an adapter for a volatile IC chip assembled within a carrier socket assembly which assures continued sufficient power to the IC chip substantially without requiring modification of the IC carrier socket assembly.

It is desired to provide such an adapter which is a low height integral assembly placeable between the socket and the printed circuit panel and occupying a minimum of bulk space and a minimum of printed circuit panel real estate.

It is desired to provide such an adapter which is easily and inexpensively manufacturable, easily handled, and easily and economically replaceable.

It is desired to provide such an adapter containing an energy source and a control circuit therefor which do not interfere with the electrical connection of pass-through non-power circuits thus minimizing possible signal degradation or slowing the speed of signal transmission.

It is also desired to provide an adapter containing one or more plated blind holes as distinguished from and in addition to plated through-holes for interrupted circuit paths.

It is further desired to provide an adapter which includes features such as dual-diameter through-holes, standoff bosses and boss-receiving apertures, component-receiving recesses, and lead-in features facilitating post insertion, or which enables insert molding of contact elements thereinto.

SUMMARY OF THE INVENTION

The present invention is an adapter for an IC chip carrier socket assembly wherein the adapter electrically connects at least one electrical component between a printed circuit panel and the circuitry of the chip carrier assembly, such as a battery and control circuit therefor for providing an assured reserve power source for the integrated circuit chip, the battery being in reserve in the event power from the primary power source is interrupted or otherwise deteriorates significantly. The adapter is a molded substrate with circuitry applied thereonto and receives the electrical component or components securely thereonto to define an adapter subassembly; thereafter the adapter subassembly is able to be assembled to the panel-proximate surface of a substantially conventional chip carrier socket and provide an interconnection means between the socket and the circuit panel, ready to receive an IC chip carrier and be mounted to a printed circuit panel.

The adapter of the invention includes an array of first contact means along the panel-mating surface electrically engageable with corresponding contact means of the printed circuit panel to which the chip carrier socket assembly will be mounted, and an array of second contact means along the socket-proximate surface and aligned and electrically engageable with corresponding contact means of the chip carrier socket. Circuit paths extend between and electrically connect associated ones of said first and second contact means. Most of the circuit paths are continuous and simply pass through the substrate and may be plated through-holes. Selected ones of the adapter circuit paths are interrupted between the associated first and second contact means for electrical connection to corresponding contact means of one or more electrical components desired to be interposed between the panel and the chip carrier assembly; the interrupted paths may be plated blind holes not extending through the substrate. Other plated through-holes can provide the means for electrically connecting segments of interrupted paths on one substrate surface with associated segments on the opposite surface.

In one embodiment wherein the electrical component desired to be connected into the assembly is a battery for reserve power, the adapter includes circuit paths for transmitting power from power conductors of the printed circuit panel to which the assembly will be mounted. First circuit path segments of the adapter's circuit paths dedicated to power transmission to the chip carrier socket and ultimately to the IC therein extend from power ones of the first contact means which are plated blind holes in which contact members are mounted which are engageable with panel power conductors to third contact means of the adapter. Interposed in the power paths are the battery and a control circuit for the battery, electrically connected to the third contact means and extending to fourth contact means of the adapter. One or more second circuit path segments electrically connect the fourth contact means with one or more power ones of the second contact means which are then connectable to power contact means of the chip carrier socket. Grounding connections are made as appropriate.

Controlling the tapping of power from the battery is a logic means such as a small outline integrated circuit (SOIC) package and secured to the adapter such as along the panel-proximate surface of the substrate centralized within the peripheral rectangular array of first contact means. The SOIC includes circuit means electrically connected to selected circuit paths (including the interrupted circuit paths for power transmission) of the adapter by panel-side contact means connected to the third contact means such as by surface mounting, to sense primary power interruption and instantaneously gate the flow of power from the battery to the socket; a battery-side contact means is connected to an additional circuit path segment of the adapter which is directly connected to the output lead of the battery. A second battery lead is connected by a further circuit path segment of the adapter to ground ones of the first contact means, to which ground contact means of the SOIC package may conveniently be connected. Thus the primary power flows from the panel's power conductor to the adapter through the SOIC for sensing and back to the adapter; then from the adapter the primary power flows to the socket to the IC. In the event the primary power fails or degrades to an out-of-tolerance condition, the SOIC will provide a gate for the flow of reserve power from the battery to the adapter to the socket and to the IC.

The adapter of the present invention thus provides a single low-profile member adapted to be placed between and electrically interconnect an IC chip carrier socket and the printed circuit panel, and containing all the circuitry for the interposing of electrical components to modify or affect or sense selected circuits between the panel and the IC, without modifying the panel or substantially modifying the chip carrier socket. The electrical components and the chip carrier socket can be assembled to the adapter, and the socket assembly can be easily handled as a unit during loading of the IC chip-carrying carrier and mounting to the printed circuit panel.

The adapter substrate of the present invention includes a generally planar molded dielectric member which facilitates the fabrication of plated blind holes and of dual-diameter plated through-holes, which is an advantage over conventionally fabricated printed circuit board elements. The adapter can also include at least one component-receiving recess within which a component can be secured such as by potting, retaining a low profile nature. The adapter also can include standoffs along the panel-proximate face to elevate the socket assembly a fixed short distance from the panel's surface. In one embodiment of the present invention, the adapter can further include shaped lead-in surfaces to facilitate insertion of panel-engaging post contact members into the first contact means of the substrate and receive solder for the posts. In another embodiment of the present invention, molding of the adapter substrate enables insert molding of contact members thereinto for eventual interconnection with an array of plated through-holes of a printed circuit panel.

An embodiment of the present invention will now be described with reference to the accompanying drawings.

DETAILED DESCRIPTION OF THE PREFERRED EMBODIMENT

FIGS. 1 to 4 illustrate a socket assembly 10 of an adapter subassembly 12 of the present invention with a chip carrier socket 20 securable thereto and the socket assembly mountable to a printed circuit panel 14. Chip carrier socket 20 will receive and contain an IC chip secured within a corresponding chip carrier (not shown) within the central recess 22 into chip carrier face 24, and an array of conductors 26 extend from contact portions electrically connectable with corresponding contact means of an IC chip carrier, outwardly to form a rectangular array peripherally around the central recess 22. The adapter subassembly 12 has an adapter substrate 40 to which a battery 80 such as a lithium energy source and a control circuit SOIC package 90 are secured. Socket assembly 10 preferably includes potting material (not shown) embedding the battery 80 and SOIC package 90 after all electrical connections have been made joining the leads or contact sections of the battery and SOIC package with corresponding contact sections of the adapter substrate 40.

Posts 42,42$_P$ are secured respectively in plated through-holes 44 and plated blind holes 46 into the panel-mounting face 48 of substrate 40 and extend outwardly to be inserted into corresponding plated through-holes or sockets 16 of panel 14 upon mounting. The socket-mounting face 50 of substrate 40 includes conductive contact pads 52 thereon for being soldered to surface mount-style contact sections 28 of the chip carrier socket 20 during assembly of chip carrier socket 20 to the adapter substrate 40 such as by reflow soldering of the contact sections 28 to contact pads 52. Chip carrier socket 20 shown is similar to a conventional product having Part No. 821542-1 sold by AMP Incorporated, Harrisburg, Pennsylvania, described as a High Pressure Tin surface mount chip carrier square socket.

Package 90 contains a small outline integrated circuit (SOIC) surface mount package such as is sold by Dallas Semiconductor under the designation DS1259S battery manager; the chip contains the circuitry for controlling the battery and is encapsulated within dielectric material. SOIC package 90 is mounted within component-receiving region 54 along panel-mounting face 48 of adapter substrate 40 and preferably within a recess 56 for low-profile benefits, after which potting material (not shown) may be applied to cover the SOIC package and seal the electrical connections. Sixteen contact sections generally designated as 92 of the package are connected to corresponding contact sections 100 to 112 of adapter substrate 40 in recess 56 to fasten the SOIC package to the adapter and interpose the chip's circuitry into the circuitry between the printed circuit panel 14 and the IC chip carrier to be inserted into socket 20. The SOIC package is preferably electrically connected and mechanically secured to the adapter substrate by conventional reflow soldering techniques such as vapor phase or infrared. Some contact sections 92 are unconnected to any circuit paths and are thus electrically inactive but serve to provide assured mechanical fastening to substrate 40 when soldered.

Battery 80 can be a lithium energy source such as a three-volt lithium battery sold by Matsushita Corporation under product identification CR 1616 or 1620. First and second battery leads 82,84 are vertical for ease of insertion into plated through-holes 58,60 in component-receiving region 62 of substrate 40. Battery 80 is preferred to be assembled last, because the reflow soldering of the contact sections of SOIC package 90 and socket 20 to corresponding contact sections of substrate 40 typically involves subjecting the assembly to temperatures high enough to have detrimental effects on the battery. To facilitate assembly of battery 80 last, socket 20 includes a central aperture 28; after all reflow soldering has been performed, battery 80 is inserted from chip carrier face 24 of socket 20 into recess 22 and through central aperture 30, with leads 82,84 then being manually soldered in plated through-holes 58,60. After soldering, potting material (not shown) is placed into central aperture 30 covering the battery and sealing the electrical connections.

Referring to FIGS. 3 to 6, adapter substrate 40 includes circuitry generally characterized as including first contact means 42,44,46 for electrical connection to the printed circuit panel socket means 16; second contact means 52 for electrical connection to the chip carrier socket contact sections 28; and conductive paths extending either directly or eventually between the first and second contact means. The conductive paths between signal ones of first contact means 42,44 and corresponding signal ones of second contact means 52 are plated through-holes providing continuous, uninterrupted circuit paths for the passing of signals transmitted from the printed circuit panel to the IC chip carrier with a minimum of signal degradation; conductive paths between ground ones 42$_G$ and 52$_G$ are also continuous, being plated through-holes.

Conductive paths between power ones 42$_P$,46 of the first contact means and power ones 52$_P$ of the second contact means are interrupted to introduce the control circuit and battery electrically into the system. For electrically connecting SOIC package 90 to socket 20 and ultimately to the IC chip therein, plated through-holes are utilized to extend through substrate 40 from panel-mounting face 48 to socket-mounting face 50. Plated path segments extend from certain ones of the first and second contact means around the periphery of substrate 40 into component-receiving regions 54,62 respectively.

SOIC package 90 generally can be described as including panel-side contact sections electrically connected ultimately to contact sections of the panel 14, and socket-side contact sections electrically connected ultimately to contact sections of the IC chip 20. Each first path segment 120 extends along panel-mounting face 48 from contact section $42_P$ in a plated blind hole 46 to contact section 102 at the SOIC package. Plated through-hole 114 extends from contact section 104 at the SOIC package on panel-mounting face 48 to socket-mounting face 50, and each second path segment 122 then extends along socket-mounting face 50 from plated through-hole 114 to contact section 58 at battery lead 82. One third path segment 124 extends along panel-mounting face 48 from contact section 60 at battery lead 84 on the panel-mounting face to contact section 106 (or commoned sections 106, if desired) at the SOIC package, while other third path segments 124 extend along socket-mounting face 50 from contact section 60 to ground ones $44,42_G$ of first contact means to establish grounding of the battery and the SOIC package to ground paths of the printed circuit panel 14. Fourth path segment 126 extends from one of contact sections 108 at the SOIC package along the panel-mounting face to one of plated through-holes 116 which extends to the socket-mounting face; the other of plated holes 116 extends from the other of contact sections 108 to the socket-mounting face, and fifth path segments 128 extend along the socket-mounting face from plated through-holes 116 to power second contact means $52_P$ for electrical connection to the chip carrier socket for transmission of power thereto and ultimately to the IC chip. Plated through-hole 118 extends from contact section 110 at the SOIC package to the socket-mounting face, and sixth path segment 130 extends along the socket-mounting face from plated through-hole 118 to contact pad $52_{PF}$ for electrical connection to a selected contact section of the socket, for signalling the IC chip of a primary power failure condition. Finally, a seventh path segment 132 extends from contact section 112 at the SOIC package along the panel-mounting face to contact section $42_{DIS}$ at a plated blind hole 46, for use in signaling the RESET circuitry in the control circuit in the SOIC package, from a selected conductive path of printed circuit panel 14; contact section $42_{DIS}$ preferably is opposed from and isolated from contact section $52_{PF}$ for optimal use of the contact section locations of panel 14, adapter substrate 40 and socket 20.

The conductive material of the through-holes, blind holes, contact pads, continuous circuit paths and circuit path segments is plated onto a previously molded dielectric substrate such as by electroless plating techniques as disclosed in U.S. Pat. Nos. 3,629,185; 3,907,621; 3,930,963; 3,993,802; 3,994,727; 4,287,253; 4,511,597; and 4,594,311 and European Patent Application No. 861020550 owned by Kollmorgen Corporation; or by a combination of electroless/electroplating such as disclosed in U.S. Pat. Nos. 3,042,591; or as disclosed in U.S. Pat. Nos. 4,532,152 or 4,604,799. Preferably a technique is followed of molding a plastic member such as for example of glass-filled polyethersulfone resin sold under the trade designation VICTREX by ICI Americas, Wilmington, Delaware. All exposed surface portions are then treated for adhesion promotion and are coated with an ultraviolet light sensitive catalyst as described in U.S. Pat. No. 4,511,597. A masking means opaque to ultraviolet light is then placed over all surfaces of the molded plastic member which are intended to remain nonconductive. All unmasked surfaces of the catalyzed and masked plastic member including through-holes and blind holes are exposed to ultraviolet light of appropriate actinic wavelength and energy level to activate the catalyst on the exposed surface areas to render the catalyzed areas receptive to plating of a metal layer thereonto. The masking means is then removed. The catalyst-activated areas are plated such as by electroless plating, or electroplating or a combination thereof, with a first layer of copper about 0.0014 inches thick. A second layer of tin about 0.0002 inches thick is then plated onto the first layer. The plated adapter substrate thus formed may then be subjected to baking or other post-curing restoration steps and cleaning steps if desired.

Alternatively, the adhesion-promoted plastic member may be selectively coated with plating resist by conventional means, and the exposed areas then electrolessly plated with commercially available plating chemistry. The resist is then removed such as with solvent. Baking or other post-curing restoration steps and cleaning steps may optionally be utilized.

Figure 1:
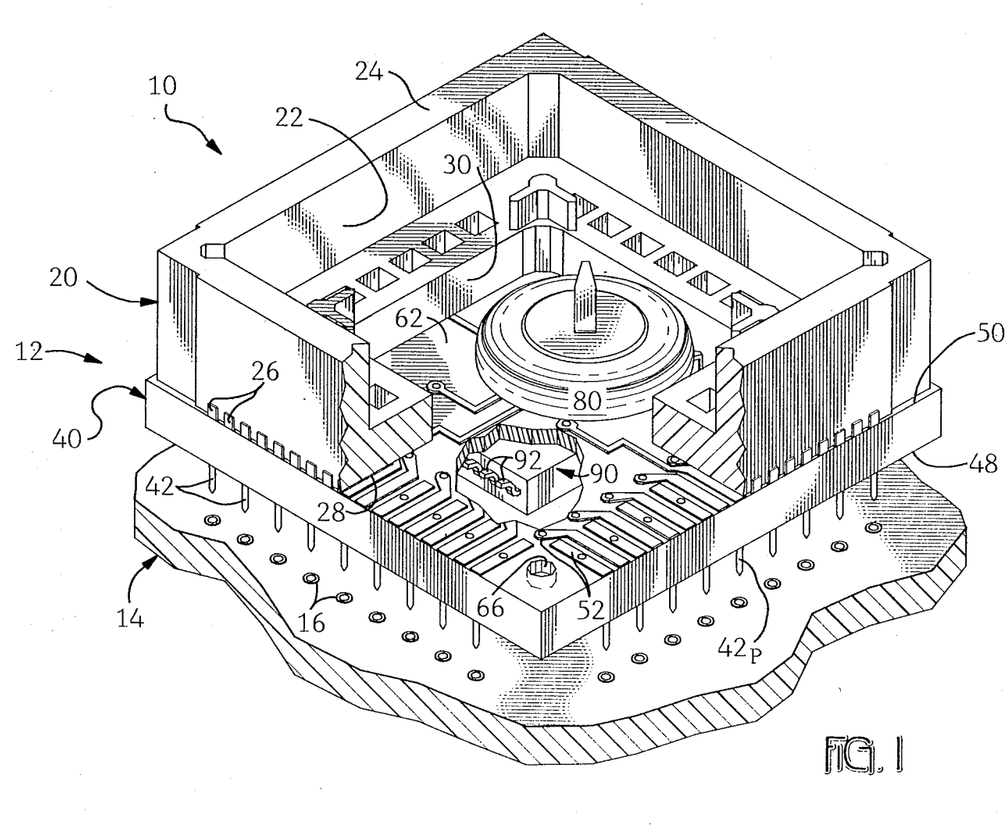
FIGS. 1 and 2 are isometric and exploded isometric views respectively, showing a chip carrier socket (without IC and carrier) and an adapter of the present invention therebetween to which a battery and a control circuit SOIC are mounted, with part of the socket of FIG. 1 broken away.
Figure 2:
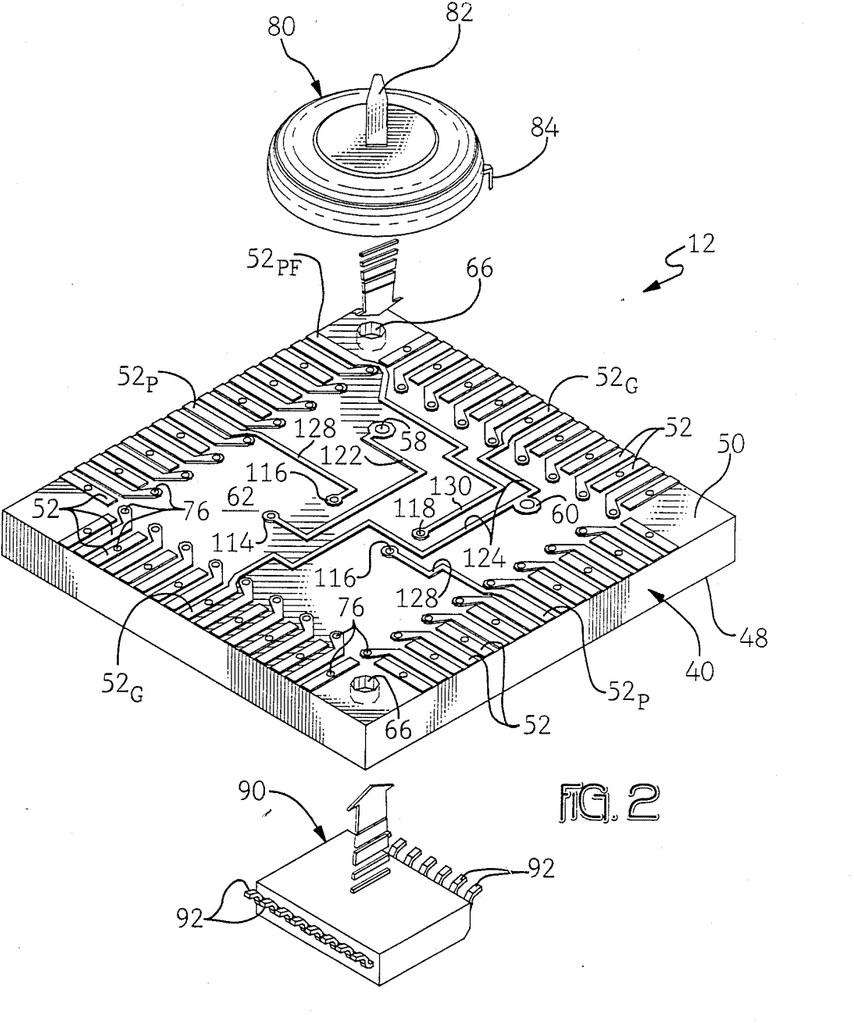
Figure 3:
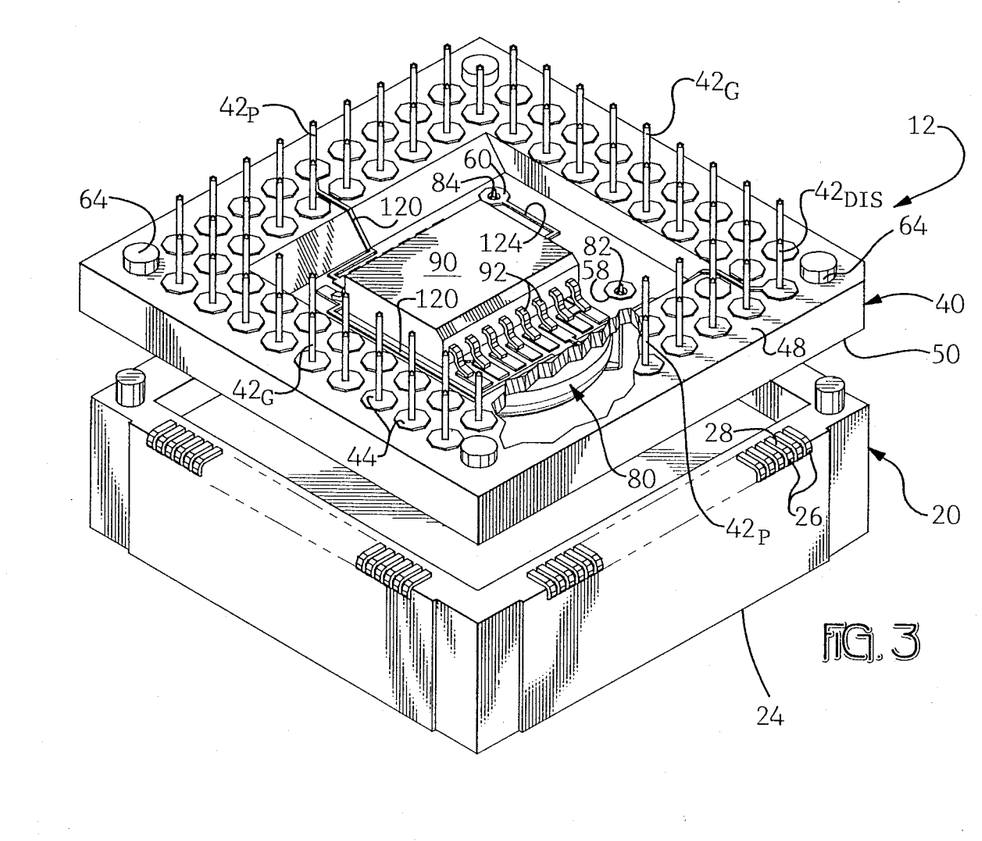
FIGS. 3 and 4 are isometric and exploded isometric views of the panel-mounting face of the assembly of FIG. 1, with part of the adapter broken away in FIG. 3.
Figure 4:
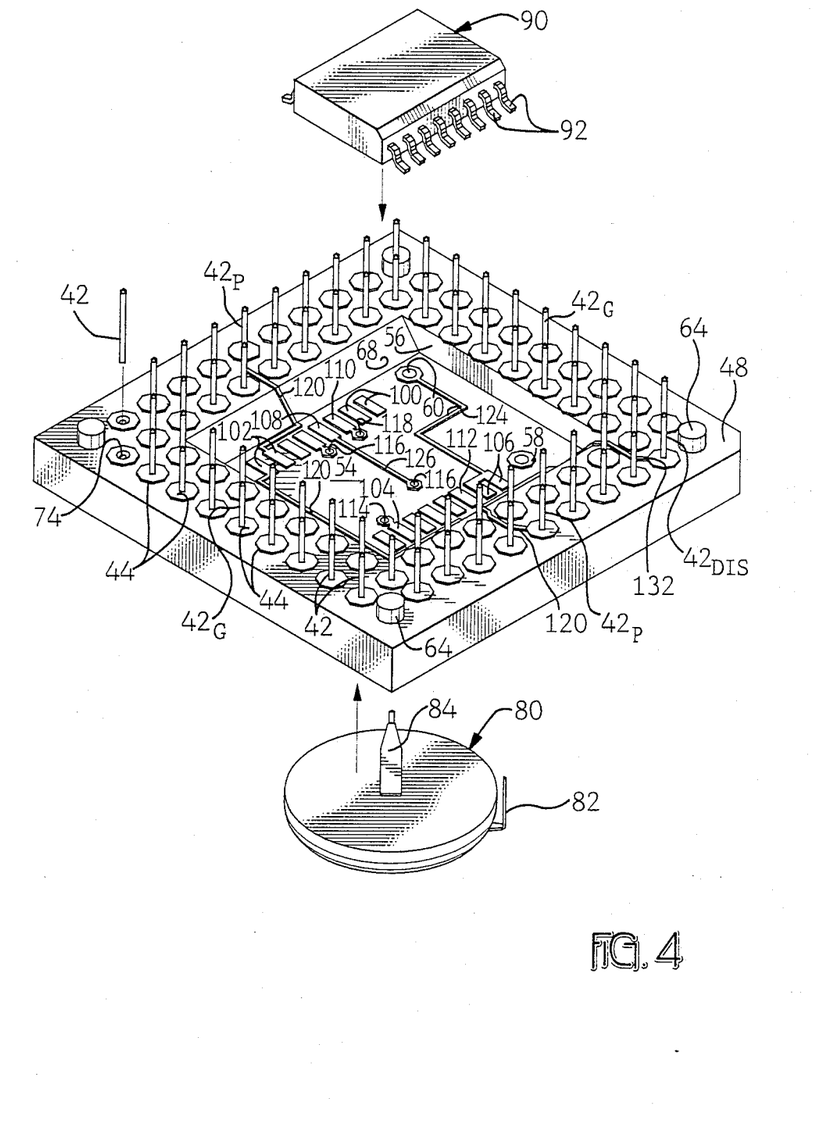
Figure 5:
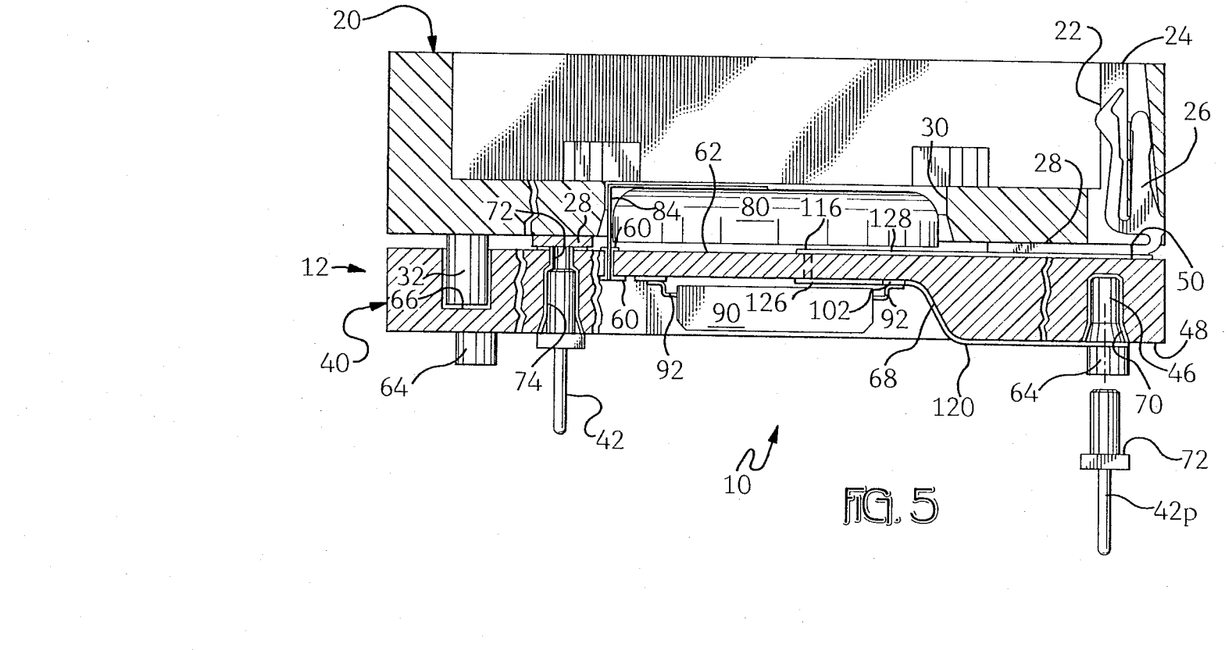
FIG. 5 is an enlarged representative section view of four types of circuit path arrangements within the adapter of FIGS. 3 and 4 including an interrupted power circuit.

The plastic member has the shape of adapter substrate 40 including recess 56; through-holes 44,58,60; 114,116,118; and blind holes 46. The plastic member may also have other desired structural features such as standoffs 64 to establish a small spacing between the substrate surface and the printed circuit panel, boss-receiving apertures 66 to receive bosses 32 of socket 20 for alignment and anti-torque and optionally polarization purposes, and tapered edge surfaces such as side walls 68 of SOIC-receiving recess 56, as shown in FIG. 5.

After plating, posts 42 are then staked or force-fit into the associated plated through-holes holes and the plated blind holes which preferably are formed during molding to have frustoconical entrances 70 (FIG. 5) for lead-in benefits, whereafter they may be soldered, thus completing the fabrication of adapter substrate 40. Posts 42 preferably have shoulders 72 therealong to provide means for assuring an appropriate selected insertion depth. Plated through-holes 44 can have a larger diameter section 74 to receive the post tightly thereinto, and a smaller diameter via section 76 extending from section 74 to second contact means 52; plated blind holes 46 have a diameter equal to the larger diameter through-hole sections 74, as well as frustoconical entrances 70. SOIC package 90 is then secured to substrate 40 such as by reflow soldering; chip carrier socket 20 is then soldered to adapter substrate 40; and both may be soldered to substrate 40 during the same mass soldering operation, with post soldering also optionally performed simultaneously therewith. Battery 80 may then be secured to substrate 40 by preferably manually soldering leads 82,84 to plated through-holes 58,60 of substrate 40. Both the battery and the SOIC package may then be potted, completing the fabrication of the adapter assembly 20.

Figure 6:
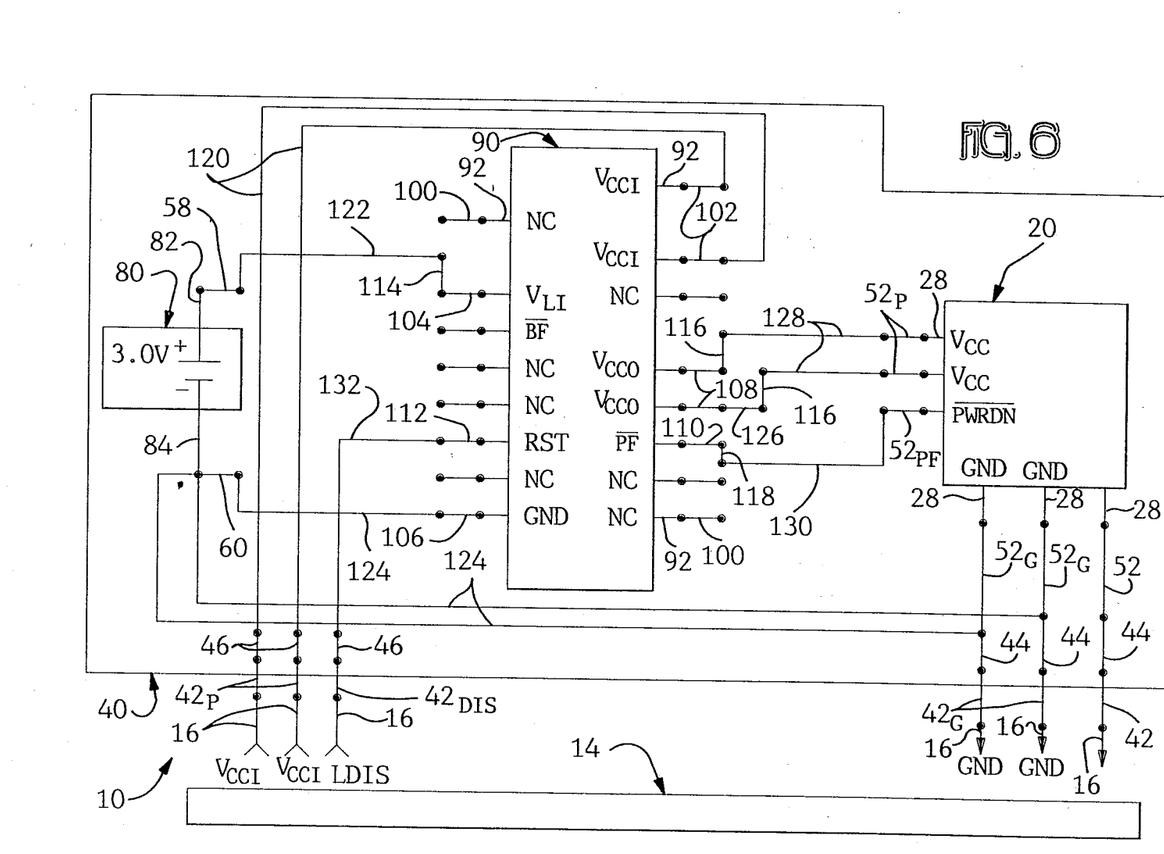
FIG. 6 is a schematic for the adapter assembly of FIGS. 1 to 5.

FIG. 6 is a schematic diagram which illustrates the electrical circuitry of the adapter and the battery and control circuit therefor, of the embodiment of FIGS. 1 to 5. The schematic is similar to that shown on page 231 of 1988 *Data Book* of Dallas Semiconductor Corporation, Dallas, Texas and illustrates the electrical connections formed by the plated circuitry of the adapter substrate of the present invention and a 3-volt battery and the DS 1259 control circuit sold by Dallas Semiconductor discussed previously. $V_{CCI}$ means primary power such as 5±0.5 volts positive from the panel by way of first power contact means 42$_P$,46; V$_{LI}$ means standby power from the battery by way of battery lead 82 and path 58,122,114,104, initiated when the SOIC package 90 detects that primary power has fallen below a lower of two threshold levels such as 4.5 volts meaning essentially complete primary power failure; V$_{CCO}$ means power to the socket 20 by way of SOIC package 90 from either the panel source or the battery as determined by the SOIC package, by way of path 108,(126),116,128,52$_P$; GND means grounding by path 106,124,60,44,42$_G$,(84); NC means no (electrical) connection; PF means power fail signal for indicating failure of the primary power from the panel, and PWRDN means power down and by path 110,118,130,52$_{PF}$ signals the IC chip that primary power V$_{CCI}$ has fallen below a higher one of two threshold levels such as between 4.75 and 4.5 volts for the IC chip to enter a low power consumption mode; RST means reset for initiating the backup status of the battery only after complete assembly and mounting to a panel 14 and being placed into service, and is connected by path 112,132,46 to a particular first contact means 42$_{DIS}$ reserved for the panel circuitry to signal the RESET logic, designated as L$_{DIS}$ or lithium disconnect; and BF means battery fail and is a logic capability of the particular logic means (DS 1259) to indicate too low a power level of the battery if electrically connected to be utilized (shown not in service).

Figure 7:
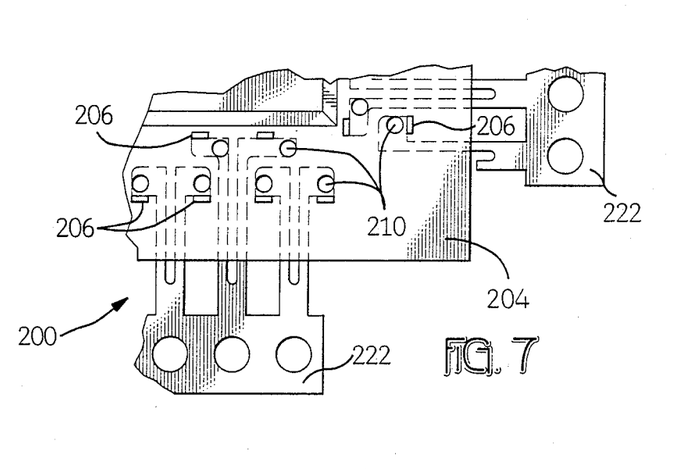
FIGS. 7 and 8 are a part perspective view and a part sectional view of another embodiment of adapter of the present invention having insert-molded panel-engaging contacts.
Figure 8:
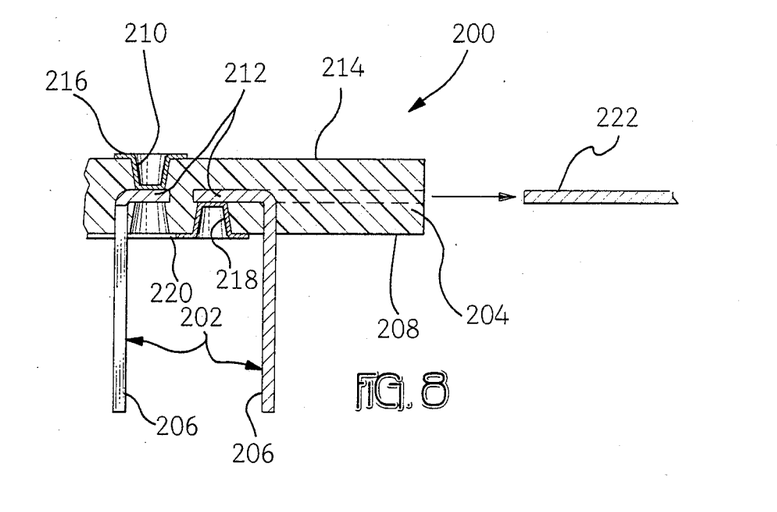

FIGS. 7 and 8 illustrate an alternate embodiment 200 of adapter substrate. The first contact means comprise stamped and formed solder tail contacts 202 insert-molded into the molded substrate 204 with tails or leg sections 206 extending from panel-mounting face 208. Holes 210 result from core pins holding embedded portions 212 of contacts 202 in place within the mold cavity during the injection molding process and extend from socket-mounting face 214 and panel-mounting face 208 at all contact locations which are pass-through connections for signal transmission and for grounding. At least the portions of holes 210 extending from socket-mounting face 214 are subsequently plated. Adjacent holes 210 and integrally plated therewith are contact sections 216 electrically connectable with corresponding contact sections of the chip carrier socket (not shown). At contact locations for interrupted circuit paths, holes 218 extend to embedded contact portions 212 from only panel-mounting face 208 and are plated. Conductive path segments 220 are plated integrally with those of contact sections 202,218 along interrupted circuit paths and extend to contact sections to which the SOIC package will be electrically connected, as in the first embodiment of FIGS. 1 to 6; conductive path segments 220 also similarly join contact sections for electrically connecting the SOIC package and the battery, as in the first embodiment. Preferably holes 210,218 have frustoconical side walls both to facilitate core pin withdrawal after molding, and to facilitate plating. The conductive paths and holes are plated to the substrate following procedures as in the first embodiment, following molding of the plastic substrate to contain the embedded portions of the solder tail contact members. Such molding may comprise retaining the contacts 202 on carrier strip segments 222 until after molding as is conventionally known. Preferably after plating procedures, the carrier strip segments are severed to complete the fabrication of the adapter substrate.

Various other features, either conductive or nonconductive, can be fabricated integrally with the adapter substrate of the present invention. Other electrical components can be used with the adapter substrate to perform other modifications as desired to the electrical performance of an IC chip electrically connected to the assembly. These and other modifications are within the spirit of the invention and the scope of the claims hereinafter set forth.

What is claimed is:

1. A substrate for being secured to an electronically active chip carrier socket for interconnecting an integrated circuit chip with a circuit panel, the socket having a plurality of contact means engaged with a like plurality of contact means of the carrier for the integrated circuit chip and required to be electrically connected to a like plurality of contact means of the circuit panel, to define with the socket an assembly desired to include at least one electrical component to be interposed along at least one electrical interconnecting circuit between the circuit panel and the integrated circuit chip, the substrate comprising:

a directional member molded of plastic material and having a generally planar shape, said dielectric member having a panel-mounting face and a socket-mounting face;

a plurality of first contact means being disposed along said panel-mounting face and associated with a respective plurality of contact means of a circuit panel and adapted to be electrically connected therewith upon mounting of said panel-mounting face of said dielectric member to said circuit panel;

a plurality of second contact means being disposed along said socket-mounting face and associated with a respective plurality of contact means of a chip carrier-receiving socket and adapted to be electrically connected therewith upon mounting of said socket to said socket-mounting face;

a least a selected one of associated said first and second contact means being electrically isolated on said dielectric member, and continuous conductive paths electrically connecting remaining ones of said first contact means and said second contact means desired to remain unaffected by an at least one electrical component disposed between said circuit panel and said socket;

said dielectric member including at least one component-receiving region on one of said panel-mounting face and said socket-mounting face for receiving a corresponding said at least one electrical component securable thereonto;

said dielectric member including at least one third and at least one fourth contact means, said at least one third contact means disposed in said at least one component-receiving region and adapted to be electrically connected to corresponding panel-side contact means of said at least one electrical component, said at least one third contact means being electrically connected to said selected at least one first contact means by first conductive path segments, said at least one fourth contact means disposed in said at least one component-receiving region and adapted to be electrically connected to corresponding socket-side contact means of said at least one electrical component, and said at least one fourth contact means being electrically connected to said selected at least one second contact means by second conductive path segments;

said continuous conductive path means, said first and second conductive path segments, and at least portions of said first, second, third and fourth contact means being plated onto respective selected surface regions of said dielectric member after molding of said member, whereby said selected at least one first contact means and associated said selected at least one second contact means become electrically connected upon the mounting of said at least one electrical component to said dielectric member.

2. A substrate as set forth in claim 1 wherein said continuous conductive paths are plated through-holes extending from said panel-mounting face to said socket-mounting face of said dielectric member, said selected at least one first contact means includes a respective plated blind hole extending into said panel-mounting face, and said first contact means and said selected at least one first contact means include post members disposed and held in respective said plated through-holes and respective said plated blind hole, said post members extending outwardly from said panel-mounting face for electrical connection with respective socket contact means of said circuit panel.

3. A substrate as set forth in claim 2 wherein said plated through-holes include a larger diameter post-receiving section in communication with said panel-mounting face, and a smaller diameter section in communication with said socket-mounting face.

4. A substrate as set forth in claim 2 wherein said plated through-holes and said plated blind holes each include a frustoconical entrance defining a lead-in means to facilitate insertion of a respective said post member.

5. A substrate as set forth in claim 1 wherein said first contact means and said selected at least one first contact means include respective contact members and a respective selected contact member insert-molded into said dielectric member prior to plating, each of said contact members and said selected contact member includes a portion embedded within said dielectric member and a contact section extending outwardly from said panel-mounting face for electrical connection with corresponding socket contact means of said circuit panel, said first contact means includes a plated hole extending from said embedded portion of respective said contact members to said socket-mounting face, and said selected at least one first contact means includes a plated hole extending from said embedded portion of selected said contact member to said panel-mounting face.

6. A substrate as set forth in claim 5 wherein said plated holes of said first contact means and said selected at least one first contact means are frustoconical to facilitate plating thereof.

7. A substrate as set forth in claim 1 wherein said dielectric member includes bosses along said panel-mounting face comprising panel standoffs.

8. A substrate as set forth in claim 1 wherein said socket-mounting face includes boss-receiving apertures cooperating with bosses of said socket facilitating orientation and alignment of said socket and said dielectric member.

9. A substrate as set forth in claim 1 wherein said at least one component-receiving region is disposed within a recess into one of said panel-mounting face and said socket-mounting face.

10. A substrate as set forth in claim 9 wherein said recess includes tapered side wall surfaces and said first and second conductive path segments extend from said selected at least one first and second contact means respectively along and traversing said tapered recess side wall surfaces to said at least one third and fourth contact means respectively within said recess.

11. A substrate as set forth in claim 1 wherein said second contact means and said selected at least one second contact means are conductive pads along said socket-mounting face for electrical connection to surface mount leg sections of said corresponding socket contact means.

12. A substrate as set forth in claim 1 wherein said at least one third and fourth contact means are conductive pads along said at least one component-receiving region for electrical connection to surface mount leg sections of said panel-side and said socket-side contact means of an electrical component.

13. A substrate as set forth in claim 1 where said dielectric member includes pluralities of said selected first and second contact means and pluralities of said third and fourth contact means, and said at least one electrical component is an integrated circuit chip carrier including a plurality of panel-side contact means and a plurality of socket-side contact means electrically connectable to respective ones of said pluralities of third and fourth contact means.

14. A substrate as set forth in claim 13 wherein said first contact means include ground ones electrically connectable to ground conductor means of said circuit panel, and ground ones of said third contact means are integrally connected by ground conductive path segments to said ground ones of said first contact means providing grounding for said at least one electrical component.

15. A substrate as set forth in claim 14 further including another electrical component, said another electrical component is a battery having a pair of leads, said integrated circuit chip electrical component contains logic means for controlling said battery, said dielectric member further includes fifth and sixth contact means for electrical connection with said battery leads, a third conductive path segment integrally connecting said fifth contact means and a corresponding seventh contact means for electrical connection with a corresponding battery-side contact means of said integrated circuit chip electrical component defining a backup power path, and a fourth conductive path segment integrally connected to at least a ground one of said first contact means, whereby when power ones of said selected first contact means are connected to power ones of said circuit panel contact means and power ones of said selected second contact means are connected to power ones of said socket contact means, and said socket, said integrated circuit chip electrical component and said battery are electrically connected to said circuitry of said dielectric member an assembly is defined for providing an assured backup power supply for an IC package mounted in said socket when the assembly is mounted onto a said circuit panel having a primary power source for said IC package.

16. A substrate as set forth in claim 15 wherein said socket includes a large central aperture enabling connection of said battery to said socket-mounting face of said dielectric member after said socket is mounted to said socket-mounting face of said dielectric member, whereby the electrical connecting of said battery leads to said fifth and sixth contact means is performable after all electrical connecting of said integrated circuit chip electrical component to said pluralities of said third and fourth contact means and electrical connecting of said socket contact means to said second and said selected second contact means.

17. A component-carrying means for being secured to an electrically active surface mountable chip carrier socket for interconnecting an integrated circuit chip with a circuit panel, the socket having a plurality of contact means engaged with a like plurality of contact means engaged with a like plurality of contact means of the carrier for the integrated circuit chip and required to be electrically connected to a like plurality of contact means of the circuit panel, to define an assembly desired to include at least one electrical component to be interposed along at least one electrical interconnecting circuit between the circuit panel and the integrated circuit chip, the component-carrying means comprising:

a dielectric means having a generally rectangular shape and a low height and having a panel-mounting face and a socket-mounting face, said dielectric means having electrical circuitry including conductive path means and a plurality of first, second, third and fourth contact means;

said plurality of first contact means being disposed along said panel-mounting face in a rectangular array near edges of said dielectric means and associated with a respective plurality of contact means of a circuit panel and adapted to be electrically connected therewith upon mounting of said panel-mounting face of said dielectric means to said circuit panel;

said plurality of second contact means being conductive pads disposed along said socket-mounting face in a like rectangular array near said edges of said dielectric means and associated with a respective plurality of surface mount contact means of a chip carrier-receiving socket and adapted to be electrically connected therewith upon surface mounting of said socket to said second-mounting face;

selected ones of associated said first and second contact means being electrically isolated on said dielectric means, and continuous conductive paths electrically connecting remaining ones of said first contact means and said second contact means desired to remain unaffected by an at least one electrical component disposed between said circuit panel and said socket;

said dielectric means including at least one component-receiving region on one of said panel-mounting face and said socket-mounting face within a respective one of said arrays of said first and second contact means, said component-receiving region for receiving a corresponding said at least one electrical component securable thereonto;

said third contact means disposed in said at least one component-receiving region and adapted to be electrically connected to corresponding panel-side contact means of said at least one electrical component, said third contact means being electrically connected to said selected ones of said first contact means by first conductive path segments, said fourth contact means disposed in said at least one component-receiving region and adapted to be electrically connected to corresponding socket-side contact means of said at least one electrical component, and said fourth contact means being electrically connected to said selected ones of said second contact means by second conductive path segments, whereby said selected first contact means and associated said selected second contact means become electrically connected upon the mounting of said at least one electrical component to said dielectric means, and said component-carrying means has a low profile and occupies no more panel real estate than the chip carrier socket.

18. A component-carrying means as set forth in claim 17 wherein said continuous conductive paths include plated post-receiving holes extending into said panel-mounting face of said dielectric means, said selected first contact means include plated blind holes extending into said panel-mounting face, and said first contact means and said selected first contact means include post members disposed and held in respective said plated post-receiving holes and respective said plated blind holes, said post members extending outwardly from said panel-mounting face for electrical connection with respective socket contact means of said circuit panel.

19. An adapter assembly for interconnecting an integrated circuit chip with a circuit panel and including at least one electrical component to be interposed along at least one electrical interconnecting circuit between the circuit panel and the integrated circuit chip, the adapter assembly comprising:

a carrier-receiving socket including a chip carrier-receiving region for receiving thereinto a carrier containing an integrated circuit chip, said socket having a plurality of chip-side contact means engageable with a like plurality of contact means of the chip carrier and further having a plurality of panel-side surface mount contact means electrically connected to respective said chip-side contact means;

a component-carrying means having a generally planar shape and low height and having a panel-mounting face and a socket-mounting face, said component-carrying means having electrical circuitry defined thereon including conductive path means and a plurality of first, second, third and fourth contact means;

said plurality of first contact means being disposed along said panel-mounting face and associated with a respective plurality of contact means of a circuit panel and adapted to be electrically connected therewith upon mounting of said panel-mounting face of said component-carrying means to said circuit panel;

said plurality of second contact means being conductive pads disposed along said socket-mounting face and associated with a respective plurality of contact means of said carrier-receiving socket and adapted to be electrically connected therewith upon surface mounting of said socket to said socket-mounting face;

selected ones of associated said first and second contact means being electrically isolated on said component-carrying means, and continuous conductive paths electrically connecting remaining ones of said first contact means and said second contact means desired to remain unaffected by an at least one electrical component disposed between said circuit panel and said socket;

said component-carrying means including at least one component-receiving region on one of said panel-mounting face and said socket-mounting face, said third contact means disposed in said at least one component-receiving region and adapted to be electrically connected to corresponding panel-side contact means of said at least one electrical component, said third contact means being electrically connected to said selected ones of said first contact means by first conductive path segments, said fourth contact means disposed in said at least one component-receiving region and adapted to be electrically connected to corresponding socket-side contact means of said at least one electrical component, and said fourth contact means being electrically connected to said selected ones of said second contact means by second conductive path segments; and said at least one electrical component mounted in said at least one component-receiving region and electrically joined to one of said third and fourth contact means of said component-carrying means and electrically connecting said selected first and second contact means, whereby said adapter assembly is adapted to be disposed between said chip carrier and said circuit panel containing at least one electrical component and having a low profile and occupying no more panel real estate than a chip carrier socket for the chip carrier.

20. An adapter assembly as set forth in claim 19 including mounted to and electrically connected with the circuitry of said component-carrying means, a battery and an SOIC control means therefor, providing a backup power supply for the integrated circuit chip to define therewith a nonvolatile random access memory module assembly.

* * * * *

UNITED STATES PATENT OFFICE
CERTIFICATE OF CORRECTION

Patent No. 4,872,844                                Dated October 10, 1989

Inventor(s) Robert K. Grebe, John E. Lucius and David S. Szczesny

It is certified that error appears in the above-identified patent and that said Letters Patent is hereby corrected as shown below:

In the Claims:

Claim 1, Column 10, Line 23, the word "directional" should be --dielectric

Claim 17, Column 13, Line 8, the word "electrically" should be --electronically--.

Signed and Sealed this

Twentieth Day of November, 1990

Attest:

HARRY F. MANBECK, JR.

Attesting Officer                Commissioner of Patents and Trademarks